United States Patent [19]  [11] 3,949,245
Emmons  [45] Apr. 6, 1976

[54] METHOD AND SYSTEM FOR SENSING CHARGES AT DISTRIBUTED POINTS ON A CHARGE COUPLED DEVICE

[75] Inventor: Stephen Perry Emmons, Dallas, Tex.

[73] Assignee: Texas Instruments Incorporated, Dallas, Tex.

[22] Filed: Oct. 24, 1974

[21] Appl. No.: 517,566

[52] U.S. Cl. ............ 307/304; 307/221 D; 307/251; 307/DIG. 3; 357/24
[51] Int. Cl.² H03K 5/18; H01L 27/00; H01L 31/00; G11C 19/00
[58] Field of Search............ 307/221 C, 221 D, 304, 307/251, DIG. 3; 357/24

[56] References Cited
UNITED STATES PATENTS

| 3,623,132 | 11/1971 | Green | 357/24 X |
| 3,858,232 | 12/1974 | Boyle et al. | 357/24 |
| 3,868,516 | 2/1975 | Buss | 307/221 D X |
| 3,877,056 | 4/1975 | Bailey | 307/221 D X |
| R27,305 | 3/1972 | Polkinghorn | 307/251 |

Primary Examiner—John S. Heyman
Assistant Examiner—L. N. Anagnos
Attorney, Agent, or Firm—Hal Levine; James T. Comfort; Richard L. Donaldson

[57] ABSTRACT

The specification discloses a technique for non-destructively sampling the charge stored adjacent distributed phase electrodes in a charge coupled device. A storage capacitor is provided with a capacitance in the range of the combined capacitance of the phase electrodes. A first switch is operable during a first clock period for connecting the capacitor to a source of reference voltage. A second switch is operable during the first clock period for connecting the phase electrodes to be sampled to circuit ground. An insulated gate field effect transistor is connected with its source and drain between the phase electrodes and the second switch. The gate of the transistor is biased at a voltage level less than the reference voltage. The first and second switches are then operable during a second clock period for coupling the charged capacitor through the field effect transistor to apply clock voltage to the phase electrodes, wherein the capacitor discharges by an amount proportional to the charge stored adjacent the phase electrodes. An output circuit is connected to the capacitor for detecting the amount of discharge of the capacitor to indirectly sample the charge.

7 Claims, 3 Drawing Figures

METHOD AND SYSTEM FOR SENSING CHARGES AT DISTRIBUTED POINTS ON A CHARGE COUPLED DEVICE

The present invention relates to charge transfer devices, and more particularly relates to signal detection configurations for charge coupled devices.

Semiconductor charge transfer devices, which include charge coupled devices (CCDs) and bucket brigades (BBs), are well known and are currently used in a large number of signal processing applications. For example, CCDs are useful as shift registers and in transversal filters and the like. In many such applications, it is necessary to sample the stored charge at distributed points, or taps, along a CCD shift register. It is desirable to perform such sampling with as little introduced noise as possible, or in other words, it would be desirable that the dominant noise associated with the sensing of a particular tap would be the uncertainty in the charge present under the CCD tap or electrode.

It has been heretofore proposed to sample the charge along a CCD with the use of a large storage capacitor having a value substantially larger than the capacitance of the clock line and the associated CCD phase electrodes. In operation, the capacitor is charged to a reference voltage while the clock line of the CCD is applied to circuit ground to discharge the associated phase electrodes. The capacitor is then connected to the clock line and the associated phase electrodes and the capacitor discharges by an amount proportional to the charges stored beneath the associated phase electrodes. The final charge across the capacitor is measured to provide an indication of the sensed charges of the CCD. For a more detailed description of this prior technique, reference is made to the application entitled "Charge Transfer Device Signal Processing System," Ser. No. 320,382, filed Jan. 2, 1973, by Walter H. Bailey (U.S. Pat. No. 3,877,056 issued Apr. 8, 1975) and assigned to the present assignee, and such disclosure is incorporated herein by reference.

From a signal-to-noise standpoint, it would be desirable to reduce the size of the capacitor used in the previously described sensing system, since the large capacitor results in a greater uncertainty of the initial charge on the capacitor, the uncertainty in the initial charge being defined by $\sqrt{kTC}$, and this uncertainty in the initial charge substantially limits the minimum charge level that can be detected in the CCD. However, in previously developed systems, reduction in the size of the sensing capacitor has been limited by the necessity to minimize fluctuations in the phase clock voltage.

In accordance with the present invention, a circuit is provided for sensing charge stored adjacent phase electrodes in a charge transfer device with the use of a capacitor of reduced size. The storge capacitor is adapted to be selectively connected to a source of reference voltage during a first clock period, such that the capacitor is charged to the reference voltage level. Circuitry is provided to discharge the phase electrodes to a predetermined voltage level during the first clock period. An impedance transformation device is connected to the phase electrodes. Circuitry is provided to connect the charged capacitor to the impedance transformation device during a second clock period for applying clock voltage to the phase electrodes. The capacitor discharges during the second clock period by an amount proportional to the charge stored adjacent the phase electrodes. An output circuit is provided to detect the amount of discharge of the capacitor.

In accordance with another aspect of the invention, a circuit is provided to sense the charge stored adjacent phase electrodes in a charge coupled device. A storage capacitor has a capacitance in the range of the combined capacitance of the phase electrodes. A first switch is operable during a first clock period for connecting the capacitor to a source of reference voltage. A second switch is operable during the first clock period for connectng the phase electrodes to circuit ground. An insulated gate field effect transistor is connected with its source and drain between the phase electrodes and the second switch. The gate of the transistor is biased at a voltage level less than the reference voltage. The first and second switches are operable during a second clock period for coupling the capacitor through the field effect transistor to apply clock voltage to the phase electrodes. The capacitor discharges by an amount proportional to the charge stored adjacent the phase electrodes during the second clock period. Output circuitry is connected to the capacitor for detecting the amount of discharge of the capacitor.

In accordance with another aspect of the invention, a method of sensing the charge stored adjacent phase electrodes in a charge coupled device includes storing a predetermined reference voltage on a capacitor during a first clock period. The phase electrodes are discharged to circuit ground during the first clock period. A bias voltage is applied to the gate of an insulated gate field effect transistor. The charge capacitor is connected through the drain and source of the transistor to apply voltage to the phase electrodes. The discharge of the capacitor is detected to provide an indication of the charge stored adjacent the phase electrodes.

For a more complete understanding of the present invention and for further objects and advantages thereof, reference is now made to the following description taken in conjunction with the accompanying drawings, in which.

Figure 1:
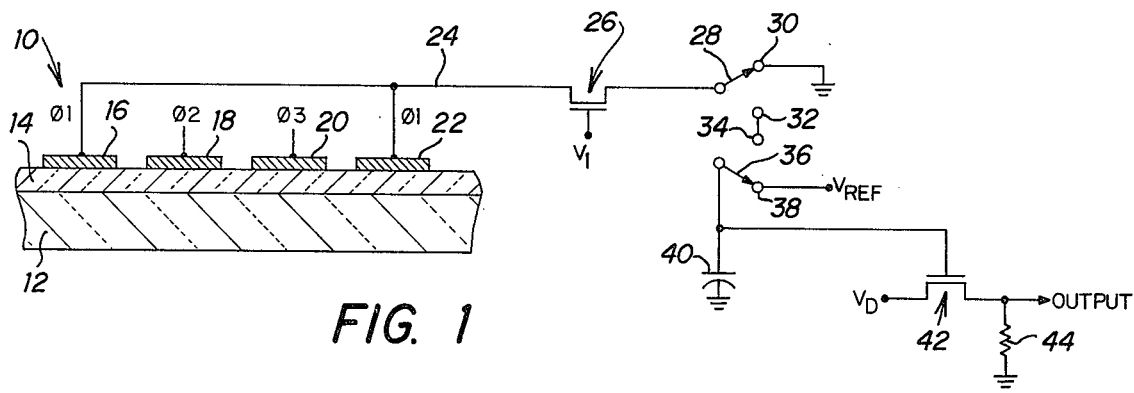
FIG. 1 is a somewhat diagrammatic illustration of an embodiment of the present CCD sensing system.

Referring to FIG. 1, a system is illustrated for nondestructively accessing information stored within a charge coupled device (CCD). The CCD is identified generally by the number 10 and is constructed by conventional semiconductor fabrication techniques which are well documented and need not be repeated herein. As is known, a CCD stores charge in potential wells or packets, and moves these packets along clock or phase electrodes in order to function as a shift register.

The CCD 10 includes a semiconductor substrate 12 which is typically P-type silicon, but of course, may comprise other types of semiconductor materials and conductivity types. A relatively thin insulating layer 14 is formed over a surface of the substrate 12 and may comprise, for example, a silicon oxide having a thickness of less than 2,000 A. A series of closely spaced phase electrodes 16–22 are spaced over the surface of the insulating layer. These electrodes are typically spaced apart on the order of 3 microns or less. In a three phase structure, a phase one clock signal is applied to electrodes 16 and 22, while phase two clock signals are applied to electrode 18 and phase three clock signals are applied to electrode 20 in order to operate the CCD in the well known manner. The illustrated CCD is a three phase device, although it will be understood that other phase CCDs can be utilized in accordance with the invention.

In the circuit shown in FIG. 1, it will be assumed that it is desired to non-destructively sample the charges stored beneath the electrodes 16 and 22. These electrodes are thus tied together via a lead 24 which is attached to the source of an insulated gate field effect transistor or MOSFET 26. A DC voltage $V_1$ is applied to the gate of the MOSFET 26, while the drain of the MOSFET 26 is connected to a switch arm 28 movable between contacts 30 and 32. Contact 30 is connected to circuit ground, while contact 32 is connected to a switch contact 34. A switch arm 36 is movable between contact 34 and contact 38. A reference voltage $V_{ref}$ is applied to contact 38.

A storage capacitor 40 is connected between switch arm 36 and circuit ground. The gate of a MOSFET 42 is connected to a terminal of the capacitor 40 and includes a drain connected to a source of bias voltage $V_D$. The source of MOSFET 42 is connected to circuit ground through a load resistance 44 and provides an output signal representative of the charge stored beneath the electrodes 16 and 22 during operation of the system.

An important aspect of the present system is the MOSFET 26 which provides an impedance transformation during operation of the system which enables the use of the capacitor 40 which is much smaller than capacitors heretofore required in previously developed systems by preventing large voltage fluctuations from being communicated as clock voltage fluctuations to the phase electrodes. For example, in prior sensing systems, the storage capacitors were required to have a capacitance much greater than the capacitance of the CCD electrodes. However, in the present system, the capacitor 40 may be equal to or slightly less than the capacitance of the combined electrodes or taps.

In operation of the circuit shown in FIG. 1, the switch arms 28 and 36 operate as a double-pole, double-throw switch and are initially set in the illustrated positions during a first clock period. In this mode, the MOSFET 26 is connected with its drain to ground and a positive DC voltage $V_1$, such as 15 volts plus the threshold voltage, is applied to the MOSFET gate. $V_1$ is substantially higher than the threshold voltage of the MOSFET. MOSFET 26 is thus on in a resistive or non-saturation mode and the phase electrodes 16 and 22 are thus discharged to circuit ground. Simultaneously, the capacitor 40 is being charged to a preset voltage $V_{ref}$, which may be, for example, 35 volts.

When the capacitor 40 is charged to the $V_{ref}$ voltage, a second clock period is initiated and the switch arm 36 is moved to contact 34 and switch arm 28 is moved to contact 32, thereby connecting the voltage across the capacitor 40 to the drain of the MOSFET 26. The DC voltage $V_1$ applied to the gate of the MOSFET 26 has been set at a DC level, such as 15 volts plus the MOSFET threshold voltage. The DC level of 15 volts is the nominal voltage to be applied to the electrodes 16 and 22 to provide proper CCD operation.

Due to the driving of the electrodes 16 and 22, a decrease occurs in the stored voltage across the capacitor 40. This voltage decrease is dependent upon the charge adjacent electrodes 16 and 22, and causes a change in the gate bias on the source follower MOSFET 42, resulting in a decrease in the output signal applied at the source of the MOSFET 42. The output signal thus comprises the difference between the nominal 35 volts stored on capacitor 40 and the voltage existing across capacitor 40 following the decay resulting from charging of electrodes 16 and 20, and the output signal is thus proportional to the charge underneath the electrodes 16 and 22. The output signal from MOSFET 42 may be detected and processed by conventional circuitry.

Due to the buffering effect of the MOSFET 26, it may be seen that the present circuit enables the use of a capacitor 40 much smaller than previously developed devices. The present circuit operates as long as the reference voltage $V_{ref}$ applied to capacitor 40 is sufficiently higher than the required charging voltage for the phase electrodes, i.e. $V_1$, such that the voltage across the capacitor 40 does not drop below the gate voltage of the MOSFET 26 under maximum charge conditions. Capacitor 40 may be provided with a relatively small capacitance without upsetting the clock voltage applied to the phase electrodes, and the $\sqrt{kTC}$ noise on the initial preset 35 volts is correspondingly reduced.

Although the present system has been illustrated as being applied to a specific type of charge transfer device, it will be understood that the system is equally applicable to various other types of CCDs and the like. Although the present system has been described relative to a three phase system, it is understood that the present circuitry may be utilized with other CCD clock configurations.

Figure 2:
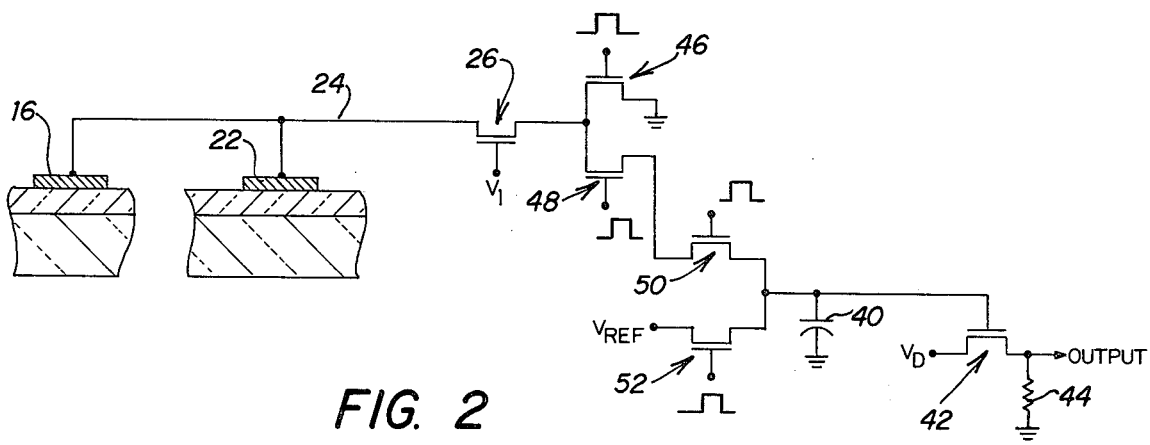
FIG. 2 is a schematic diagram of the system shown in FIG. 1 with MOSFETs being utilized to provide the switching functions for the system.

FIG. 2 illustrates a system substantially identical to that shown in FIG. 1, except that MOSFET devices are utilized insteaad of the mechanical double-pole, double-throw switches shown in FIG. 1. Corresponding numerals are provided in FIG. 2 for corresponding and like parts shown in FIG 1.

Thus, electrodes 16 and 22 are connected via the lead 24 to the MOSFET 26. The drain of MOSFET 26 is connected to a terminal of a MOSFET 46 which is responsive to a time impulse applied to its gate for switching the MOSFET 26 into and out of contact with circuit ground. The drain of MOSFET 26 is also connected to a MOSFET switch 48 which is responsive to clock signals applied to its gate in order to switch the drain of the MOSFET 26 into and out of contact with a third MOSFET switch 50. MOSFET 50 is responsive to clock signals applied to its gate to switch the capacitor 40 into and out of contact with the MOSFET 26 in the manner previously described. A fourth MOSFET switch 52 is connected between the capacitor 40 and the source of reference voltage $V_{ref}$ in order to selectively charge the capacitor 40 in response to clock signals applied to the gate of MOSFET 52. MOSFET 42 operates as a source follower to provide an output signal across the load resistance 44 in the manner previously described.

Figure 3:
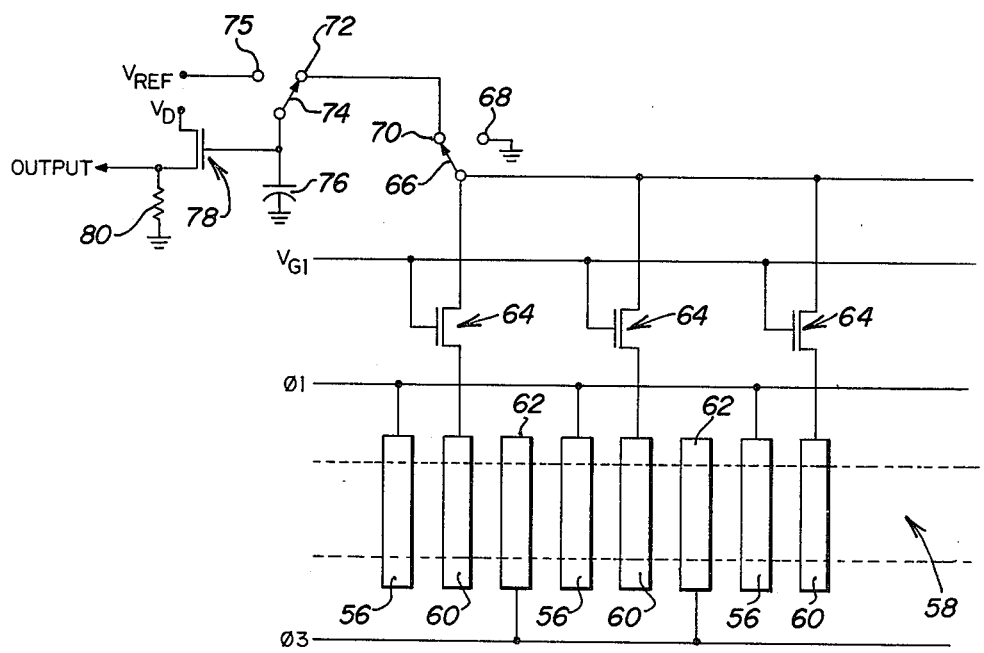
FIG. 3 is a schematic circuit for sensing the charge on phase electrodes of a single clock line in a multi-clock CCD register configuration.

FIG. 3 illustrates a somewhat diagrammatic top view of a three phase CCD utilizing the present invention. A plurality of phase one electrodes 56 span the CCD channel 58 in a well known manner. Similarly, phase two electrodes 60 span channel 58 and are disposed adjacent to the phase three electrodes 62 in order to define a conventional three phase CCD. Phase one and phase three clock signals are applied to electrodes 56 and 62, respectively, in the conventional manner.

A circuit according to the present invention is connected to the phase two electrodes 60 in order to sense the charge stored thereunder. MOSFETs 64 are connected at their sources to the electrodes 60 and are interconnected at their gates to a source of voltage $V_1$. MOSFETs 64 are connected at their drains to a first switch arm 66 which is movable between contacts 68 and 70. Switch contact 68 is connected to circuit ground and contact 70 is connected to a switch contact 72. A switch arm 74 is movable between contact 72 and a contact 75 which is connected to receive a source of reference voltage $V_{ref}$. The movable switch arm 74 is connected to a terminal of the capacitor 76 and a MOSFET 78 is connected across the capacitor 76 and is interconnected with a load resistance 80 in order to provide an output signal in the manner previously described.

The system illustrated in FIG. 3 operates identically to that previously described in FIG. 1. The MOSFET 64 introduces an impedance transformation which enables the use of a high reference voltage $V_{ref}$ and a relatively small capacitor 76, while still providing an adequate clock voltage for application to the electrodes 60. The kTC noise is held to a minimum in the system thereby providing improved operation.

The MOSFETs illustrated in FIGS. 1-3 will generally be fabricated by conventional techniques on the substrate adjacent the CCD devices. Examples of typical MOSFET and CCD fabrication may be found in the previously identified patent application Ser. No. 320,382.

Whereas the present invention has been decribed with respect ot specific embodiments thereof, it will be understood that various changes and modifications will be suggested to one skilled in the art, and it is intended to encompass such changes and modifications as fall within the scope of the appended claims.

What is claimed is:

1. A circuit for sensing charge stored adjacent phase electrodes in a charge transfer device comprising:
    a storage capacitor having a capacitance not greater than the combined capacitances of said phase electrodes;
    means for selectively applying a reference voltage to said storage capacitor during a first clock period thereby to charge said capacitor to said reference voltage level;
    an impedance transformation insulated gate field effect transistor having a channel connected to said phase electrodes to suppress voltage fluctuations, said transistor having a gate bias voltage substantially less than said reference voltage level;
    means for connecting the channel of said field effect transistor to a predetermined voltage level during a first clock period to cause conduction of said transistor in a non-saturated mode, thereby discharging said phase electrodes to said predetermined voltage level;
    means for connecting said charged capacitor to the channel of said transistor during a second clock period thereby applying a clock voltage level to said phase electrodes determined by said gate bias voltage, wherein said capacitor discharges during said second clock period by an amount determined by the charge stored adjacent said phase electrodes; and
    output circuit means for detecting the amount of discharge of said capacitor.

2. The circuit of claim 1, wherein said means for connecting said channel of said transistor to said predetermined voltage level during said first clock period comprises an insulated gate field effect transistor and wherein said predetermined voltage level is circuit ground.

3. The circuit of claim 1 wherein said means for selectively applying comprises an insulated gate field effect transistor.

4. The circuit of claim 1 wherein said output means comprises a source follower circuit including an insulated gate field effect transistor connected at its gate to said capacitor, connected at its drain to a bias supply and connected at its source to circuit ground through a load resistance.

5. A circuit for sensing the charge stored adjacent phase electrodes in a charge coupled device comprising:
    a storage capacitor having a capacitance not greater than the combined capacitances of said phase electrodes;
    first insulated gate field effect transistor means operable during a first clock period for connecting said capacitor to a source of reference voltage;
    second insulated gate field effect transistor means having one end of its channel connected to said phase electrodes, the gate of said second transistor means being biased at a voltage level substantially less than said reference voltage;
    further insulated gate field effect transistor switching means operable during a second clock period for coupling said charged capacitor through the channel of said second field effect transistor means to apply a clock voltage to said phase electrodes, said clock voltage being determined by said gate bias voltage level of said second transistor, wherein said capacitor discharges by an amount determined by the charge stored adjacent said phase electrodes; and
    insulated gate field effect transistor amplifier means for detecting the amount of discharge of said capacitor.

6. A circuit for sensing charge stored adjacent phase electrodes in a charge transfer device comprising:
    a storage capacitor having a capacitance not greater than the combined capacitances of said phase electrodes;
    means for selectively applying a reference voltage to said storage capacitor during a first clock period thereby to charge said capacitor to said reference voltage level;
    a plurality of impedance transformation insulated gate field effect transistors having channels connected respectively to said phase electrodes to suppress voltage fluctuations, said transistors having a common gate bias voltage substantially less than said reference voltage level;
    means for connecting the channels of said field effect transistors to a common predetermined voltage level during a first clock period to cause conduction of said transistors in a non-saturated mode, thereby discharging said phase electrodes to said predetermined voltage level;
    means for connecting said charged capacitor to the channels of said transistors during a second clock period thereby applying a clock voltage level to said phase electrodes determined by said gate bias voltage, wherein said capacitor discharges during said second clock period by an amount determined by the charge stored adjacent said phase electrodes; and output circuit means for detecting the amount of discharge of said capacitor.

7. The method of sensing the charge stored adjacent phase electrodes in a charge coupled device comprising:

storing a predetermined reference voltage on a capacitor during a first clock period, said capacitor having a capacitance not greater than the combined capacitances of said phase electrodes;

discharging said phase electrodes to circuit ground during said first clock period;

applying a bias voltage substantially less than said reference voltage to the gate of an insulated gate field effect transistor;

connecting the charged capacitor through the channel of said transistor to apply a clock voltage to said phase electrodes equal to said bias voltage less the threshold voltage of said transistor; and detecting the amount of discharge of said capacitor to provide an indication of the charge stored adjacent said phase electrodes.

* * * * *